(12) United States Patent
Desclos et al.

(10) Patent No.: US 7,528,790 B2
(45) Date of Patent: May 5, 2009

(54) SYSTEM AND METHOD FOR PREVENTING COPYING OF ELECTRONIC COMPONENT DESIGNS

(75) Inventors: Laurent Desclos, San Diego, CA (US); Seung-Woong Choi, Giheung-gu (KR); Jun-Ho Park, Bucheon-si (KR); Sung-Ki Jung, DongAn-Gu (KR); B. S. Kwak, Gunpo-si (KR); Ki-Su Kim, Gunpo-si (KR); Seong-Woo Lee, Seongnam-si (KR)

(73) Assignee: Ethertronics, Inc., San Diego, CA (US)

( * ) Notice: Subject to any disclaimer, the term of this patent is extended or adjusted under 35 U.S.C. 154(b) by 140 days.

(21) Appl. No.: 11/761,955

(22) Filed: Jun. 12, 2007

(65) Prior Publication Data

US 2008/0309574 A1 Dec. 18, 2008

(51) Int. Cl.
*H01Q 1/52* (2006.01)

(52) U.S. Cl. ............... 343/841; 34/700 MS; 34/895

(58) Field of Classification Search ........... 343/841, 343/700 MS, 702, 846, 895; 174/35 R; 340/10.1, 340/572.7, 572.8
See application file for complete search history.

(56) References Cited

U.S. PATENT DOCUMENTS

| 5,367,308 | A |   | 11/1994 | Weber |
| 6,121,544 | A | * | 9/2000  | Petsinger ............. 174/353 |
| 6,359,598 | B1 |  | 3/2002  | Sullivan |
| 6,744,410 | B2 | * | 6/2004 | Shamblin et al. ........... 343/702 |
| 6,859,175 | B2 | * | 2/2005 | Desclos et al. .......... 343/700 MS |
| 6,900,773 | B2 |  | 5/2005 | Poilasne et al. |
| 6,911,940 | B2 | * | 6/2005 | Poilasne et al. ........ 343/700 MS |
| 7,084,813 | B2 | * | 8/2006 | Pathak et al. .......... 343/700 MS |
| 2004/0056334 | A1 |  | 3/2004 | Longden et al. |
| 2007/0040653 | A1 | * | 2/2007 | Potts et al. ................ 340/10.1 |

OTHER PUBLICATIONS

PCT Search Report dated Jul. 28, 2008 for PCT application No. PCT/US08/66431.

\* cited by examiner

*Primary Examiner*—Hoang V Nguyen
(74) *Attorney, Agent, or Firm*—Coastal Patent, LLC; Joshua S. Schoonover

(57) ABSTRACT

Techniques are provided to prevent undesired and/or unauthorized analysis and access to electronic components designs. A shield can be utilized to prevent invasive and/or non-invasive analysis methods such as the use of x-rays to determine the structural configuration and/or component makeup of an embedded antenna. In addition, a damageable material that can be utilized alone or in conjunction with the shield is also provided. When attempting to access the antenna and/or components included therein, any inappropriate force or exposure to certain elements, such as heat, will cause the material and the antenna and/or the components therein to be damaged or melted beyond a point of useful recognition for the entity. Furthermore, thin films can be utilized to construct one or more portions of the antenna to the same effect. In addition, the antenna and/or components can be configured for actively reconfiguring a resonant frequency of the antenna.

32 Claims, 15 Drawing Sheets

SYSTEM AND METHOD FOR PREVENTING COPYING OF ELECTRONIC COMPONENT DESIGNS

FIELD OF THE INVENTION

The present invention relates generally to the field of wireless communications and devices. More particularly, the present invention relates to the design of electronic components, such as antennas.

BACKGROUND OF THE INVENTION

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

As new generations of handsets and other wireless communication devices become smaller and embedded with more and more applications, new antenna designs will be needed to provide solutions to inherent limitations of these devices. With classical antenna structures, a certain physical volume is required to produce a resonant antenna structure at a particular radio frequency and with a particular bandwidth. In multi-band applications, more than one such resonant antenna structure may be required. With the advent of a new generation of wireless devices, such classical antenna structure will need to take into account beam switching, beam steering, space or polarization antenna diversity, impedance matching, frequency switching, mode switching, etc., in order to reduce the size of devices and improve their performance.

In addition, it is at least in part, the physical structure and/or configuration of the new antenna designs that provides the functionality described above. In contrast to, for example, software-based inventions, where actual software code can be protected and/or hidden, the physical structures and/or configurations can easily be identified, studied, and replicated simply by disassembling or x-raying a wireless communication device in which an antenna is embedded. With increasing numbers of electronic device and component manufacturers, the risk of unauthorized copying/reverse-engineering of electronic components, such as these new antenna designs also increases. Therefore, there is a need for electronic components, such as antennas which can be configured to have certain desired properties while at the same time making it difficult or altogether impossible to reverse-engineer and copy.

SUMMARY OF THE INVENTION

Various embodiments of the present invention provide techniques to prevent undesired and/or unauthorized analysis and access to electronic components designs. According to one embodiment of the present invention, a shield can be utilized to prevent invasive and/or non-invasive analysis methods such as the use of x-rays to determine the structural configuration and/or component makeup of an embedded antenna. Another embodiment of the present invention provides a damageable material that can be utilized alone or in conjunction with the shield. When attempting to access the antenna and/or components included therein, any inappropriate force or exposure to certain elements, such as heat will cause the antenna and/or the components therein to be damaged or melted beyond a point of useful recognition for the entity. Yet another embodiment of the present invention utilizes materials, such as thin films to construct one or more portions of the antenna to the same effect. In addition, the antenna and/or components can be configured for actively reconfiguring a resonant frequency of the antenna.

These and other advantages and features of the invention, together with the organization and manner of operation thereof, will become apparent from the following detailed description when taken in conjunction with the accompanying drawings, wherein like elements have like numerals throughout the several drawings described below.

DETAILED DESCRIPTION OF THE PREFERRED EMBODIMENTS

Figure 1A:
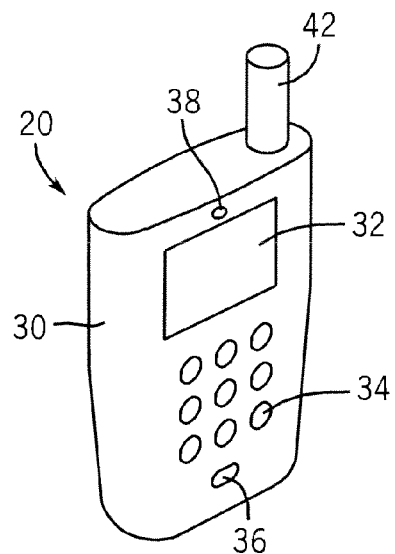
FIGS. 1A-D illustrate embodiments of a mobile device according to various embodiments of the present invention.
Figure 1B:
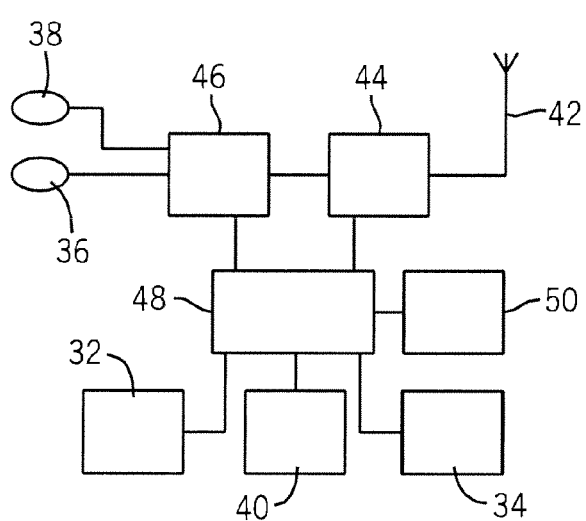
Figure 1C:
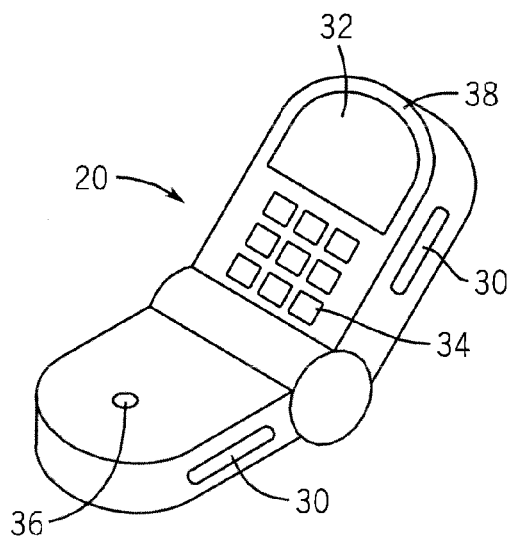
Figure 1D:
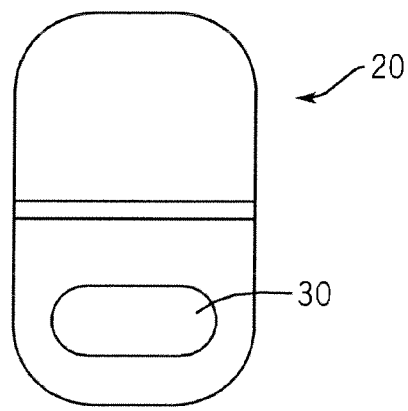

In the following description, for purposes of explanation and not limitation, details and descriptions are set forth in order to provide a thorough understanding of the present invention. However, it will be apparent to those skilled in the art that the present invention may be practiced in other embodiments that depart from these details and descriptions.

In various embodiments of the invention shown in FIGS. 1A-1D, a mobile device (20), such as a mobile telephone, includes a conductive structure (30), a display (32) in the form of a liquid crystal display, a keypad (34), a microphone (36), an speaker (38), a battery (40), an antenna (42), radio interface circuitry (44), codec circuitry (46), a controller (48) and a memory (50). In the embodiment shown in FIGS. 1A and 2C, the conductive structure (30) comprises the device housing, which, in this example, comprises a conductive material, such as stainless steel. In this embodiment, a user of the mobile device (20) effectively becomes coupled to the antenna (42) by holding onto the conductive structure (30) comprising the housing in a manner such that the user becomes part of the antenna (42) when the device (20) is in use.

The conductive structure (30) can alternatively be inside the housing. For example, the housing can comprise a plastic shell and a conductive structure, such as a metal plate, can be embedded inside the housing. Alternatively, the conductive structure (30) can be secured on the inside surface of the housing or in another area inside the housing. In this embodiment, the user becomes effectively coupled to the antenna (42) through capacitive coupling with the conductive structure (30) by holding onto the mobile device (20) in an area near the conductive structure (30). In this manner, the user becomes part of the antenna (42) similar to the way a user became part of so-called "rabbit ears" television antennas of days past. It should be noted however, that various embodiments of the present invention do not require the conductive structure (30) in order to effectuate proper operation.

Different embodiments of antennas may be used which may be actively changed or configured, with resultant small or large changes in characteristics of the antenna being achieved. One characteristic that is configurable is resonant frequency. In one embodiment, a frequency shift in the resonant frequency of the antenna can be actively induced, for example, to follow a spread spectrum hopping frequency (Bluetooth, Home-RF, etc.,). In addition to providing enhanced low frequency performance embodiments of the present invention also provide very small and highly isolated antennas that covers a few channels at a time, with the ability to track hopping frequencies quickly, improving the overall system performance.

In one embodiment, an antenna is provided with frequency switching capability that may be linked to a particular user, device, or system defined operating mode. Mode changes are facilitated by active real time configuration and optimization of an antenna's characteristics, for example as when switching from a 800 MHz AMPS/CDMA band to a 1900 MHz CDMA band or from a 800/1900 MHz U.S. band to a 900/1800 MHz GSM Europe and Asia band.

In one embodiment, the present invention comprises a configurable antenna that provides a frequency switching solution that is able to cover multiple frequency bands, either independently or at the same time A software-defined antenna for use in a software defined device is also disclosed. The device may comprise a wireless communications device, which may be fixed or mobile. Examples of other wireless communications devices within the scope of the present invention include cell phones, PDAs, and other like handheld devices.

Communication devices and antennas operating in one or more of frequency bands used for wireless communication devices (450 MHz, 800 MHz, 900 MHz, 1.575 GHz, 1.8 GHz, 1.9 GHz, 2 GHz, 2.5 GHz, 5 GHz,) are also considered to be within the scope of the invention. Other frequency bands are also considered to be within the scope of the present invention. Embodiments of the present invention provide the ability to optimize antenna transmission characteristics in a network, including radiated power and channel characteristics.

In one or more embodiments, channel optimization may be achieved by providing a beam switching, beam steering, space diversity, and/or multiple input-multiple output antenna design. Channel optimization may be achieved by either a single element antenna with configurable radiation pattern directions or by an antenna comprising multiple elements. The independence between different received paths is an important characteristic to be considered in antenna design. The present invention provides reduced coupling between multiple antennas, reducing correlation between channels.

The antenna design embodiments of the present invention may also be used when considering radiated power optimization. In one embodiment, an antenna is provided that may direct the antenna near-field toward or away from disturbances and absorbers in real time by optimizing antenna matching and near-field radiation characteristics. This is particularly important in handset and other handheld device designs, which may interact with human bodies (hands, heads, hips, etc.) In one embodiment, where one antenna is used in a communications device, input impedance may be actively optimized (control of the reflected signal, for example). In one embodiment where a device comprises multiple antennas, each antenna may be optimized actively and in real time.

Figure 2A:
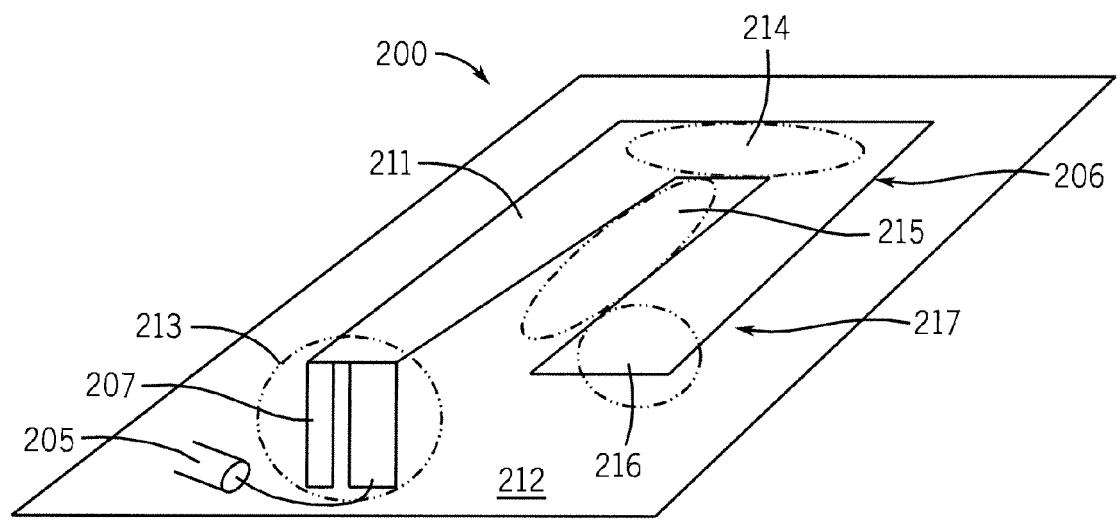
FIG. 2A illustrates a three dimensional view of one embodiment of an antenna.
Figure 2B:
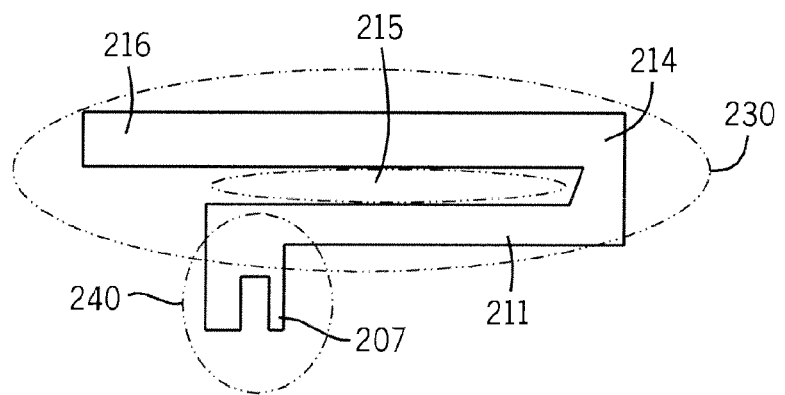
FIG. 2B illustrates a bottom view of the antenna of FIG. 2A.

FIGS. 2A and 2B illustrate respective three-dimensional and bottom views of one embodiment of one or more portions of a capacitively loaded magnetic dipole antenna (200). In one embodiment, antenna (200) comprises a top portion (206) disposed opposite a ground plane portion (212), with the top portion (206) coupled to the ground plane portion (212) by a ground connection portion (207). In one embodiment, a generally planar disposition of the top portion (206) and an opposing generally planar disposition of the ground portion (212) define a first gap area (217). In one embodiment, ground portion (212) is coupled to top portion (206) by ground connection portion (207) in an area indicated generally as feed area (213). In one embodiment, ground portion (212) comprises a ground plane.

In one embodiment, within the feed area (213), a signal feed line portion (205) is coupled to the top portion (206). In one embodiment, the top portion (206) comprises a first portion (216) and a second portion (211), with the first portion (216) coupled to the second portion (211) by a connection portion (214). In one embodiment, first portion (216) and second portion (211) are opposingly disposed in a plane and define a second gap area (215). In one embodiment, one or more portion (205), (207), (211), (212), (214), and (216) may comprise conductors. In one embodiment, one or more portion (205), (207), (211), (212), (214), and (216) may comprise conductive flat plate structures. It is understood, that top portion (206) and ground plane (212) may comprise structures other than flat-plate structures. For example, one or more portion, (205), (207), (211), (212), (214), and (216) may comprise rods, cylinders, etc. It is also understood that the present invention is not limited to the described geometries, as in other embodiments the top portion (206), the ground plane (212), the first portion (216), and the second portion (211) may be disposed relative to each other in other geometries. For example, top conductor (206) may be coupled to ground plane portion (212), and first portion (216) may be coupled to second portion (211) such that one or more of the portion are in other than parallel relationships. Thus, it is understood that antenna (200), as well as other antennas described herein, may vary in design and yet remain within the scope of the claimed invention.

As will be understood with reference to the foregoing Description and Figures, one or more of portions (205), (207), (211), (212), (214), and (216), as well as other described further herein, may be utilized to effectuate changes in the operating characteristics of a capacitively loaded magnetic dipole antenna. In one embodiment, one or more of portions (205), (207), (211), (212), (214), and (216) may be utilized to alter the capacitive and/or inductive characteristics of a capacitively loaded magnetic dipole antenna design. For example, one or more of portions (205), (207), (211), (212), (214), and/or (216) may be utilized to reconfigure impedance, frequency, and/or radiation characteristics of a capacitively loaded magnetic dipole antenna.

FIG. 2B further illustrates that one or more of portions (211), (214), (215), and/or (216) can comprise a radiation part (230) of the antenna (200). In addition, one or more of portions (205) and/or (207) can comprise a matching part (240) of the antenna (200). Such a configuration effectuates desired properties of the antenna (200) in a "continuous" structure.

Figure 3A:
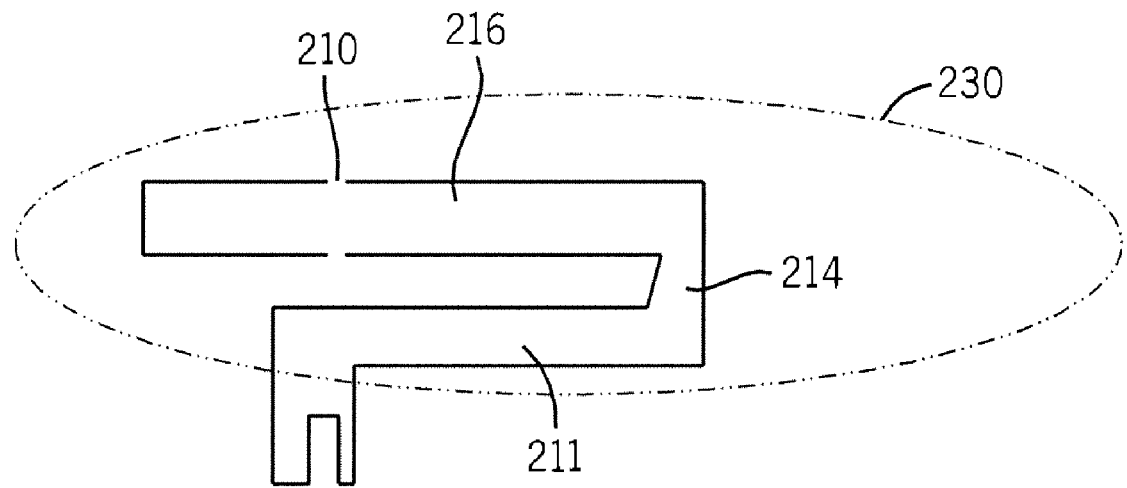
FIG. 3A illustrates a bottom view of a detuned antenna according to various embodiments of the present invention.
Figure 3B:
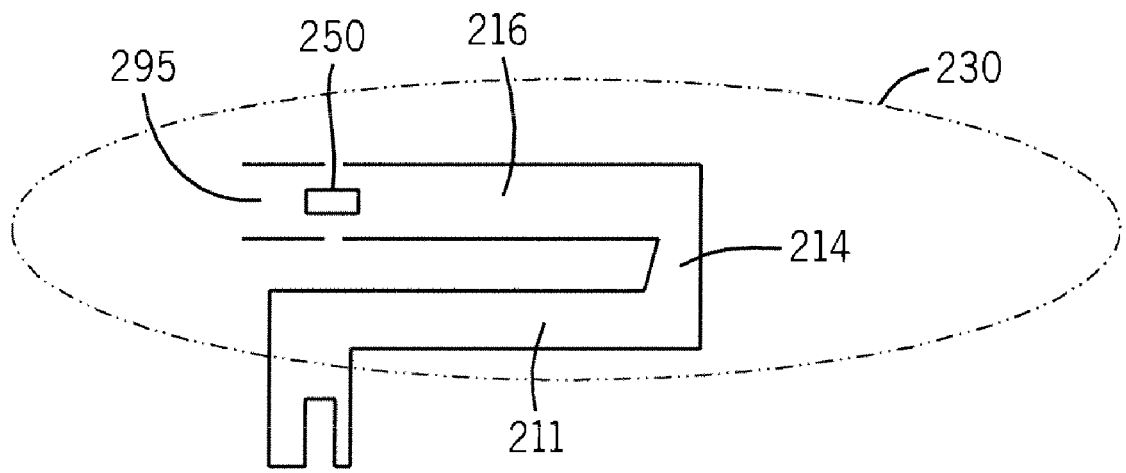
FIG. 3B illustrates a bottom view of an antenna configured according to another embodiment of the present invention.
Figure 6A:
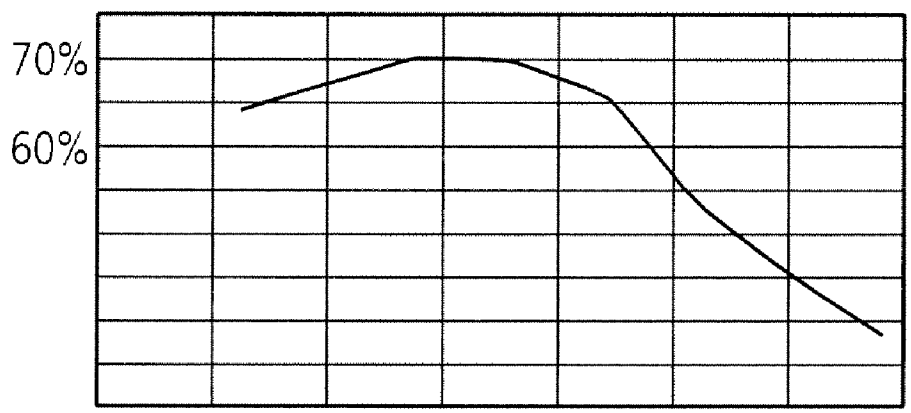
FIGS. 6A and 6B illustrate achieved return loss and efficiency of an antenna configured according to another embodiment of the present invention.
Figure 6B:
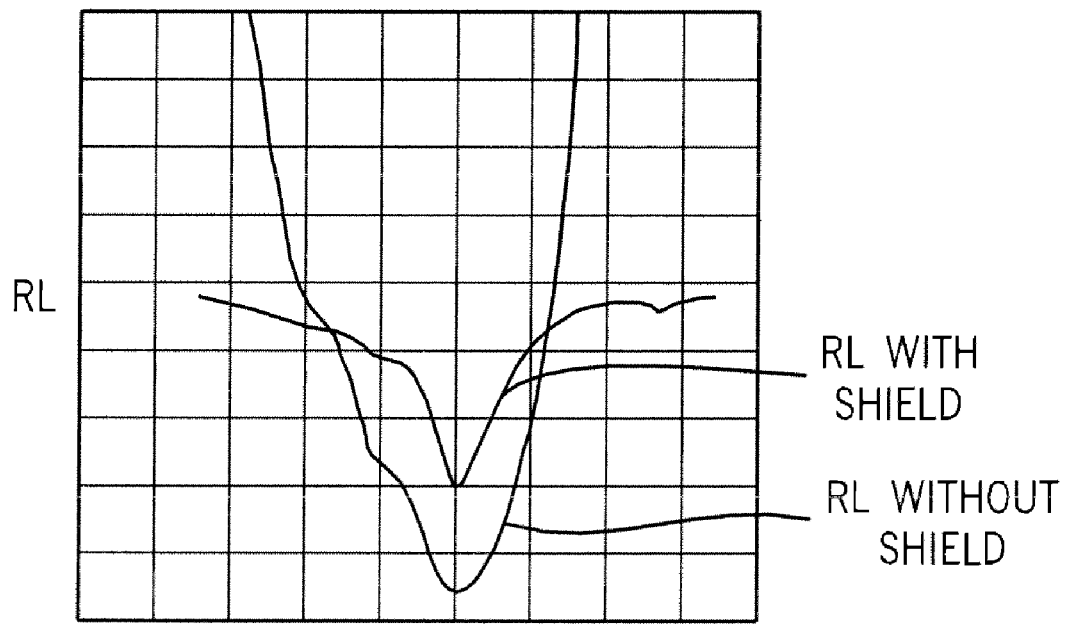
Figure 7A:
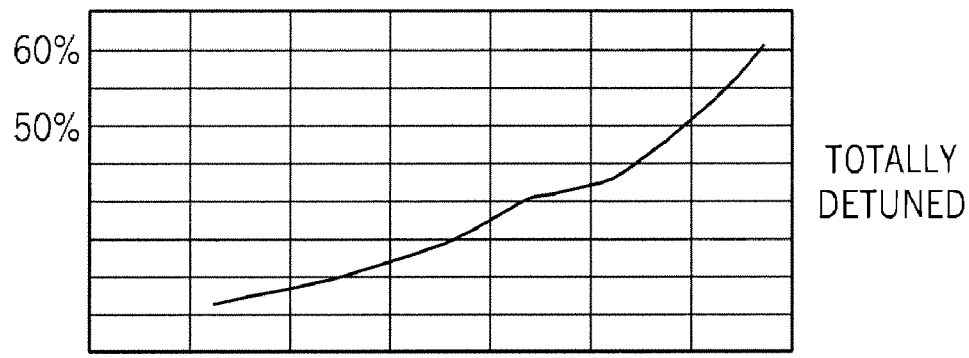
FIGS. 7A and 7B illustrate achieved return loss and efficiency of a detuned antenna configured according to various embodiments of the present invention.
Figure 7B:
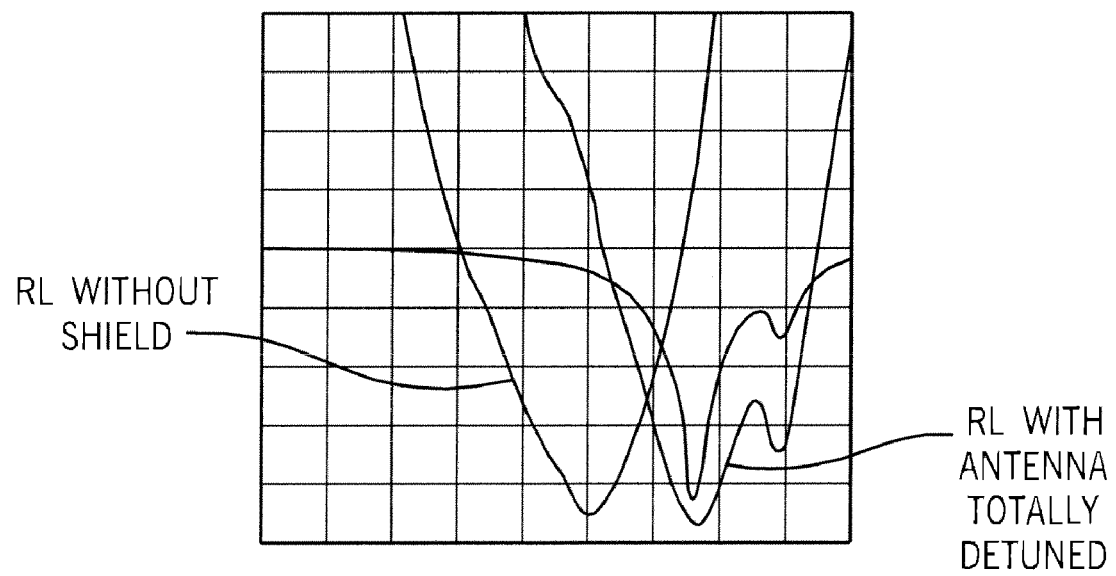

FIG. 3A illustrates the antenna (200) as being "cut" in one or more areas, for example, at area (210) of the radiation part (230) to effectively detune the entire antenna (200). It should be noted that the antenna (200) can be cut in various ways, e.g., along the length of the first portion (216) as opposed to across the length of the first portion (216). In addition, the antenna (200) need not be literally cut after construction, but can merely be constructed as having two or more operative portions. When the antenna (200) is detuned, the observed return loss (RL) and efficiency indicates that the antenna (200) is rendered more or less ineffective. FIGS. 7A and 7B illustrate graphical representations of the performance of antenna (200) when it is totally detuned. However, as shown in FIG. 3B, when a component (250) is utilized to reproduce a continuous structure, the radiative properties of the antenna (200) can be reproduced. Referring to FIGS. 6A and 6B, graphical representations of the observed RL and efficiency of the antenna (200) show an efficiency of approximately 60%-70%. It should be noted that one or more portions (216), (211), and/or (214) can be cut in one or more areas and reconstructed with one or more components (250). In addition, the component (250) can comprise inductors or other elements which can add inductive and/or electrical properties to reconstruct one or more portions (216), (211), and/or (214) to return the desired radiative properties to the antenna (200) as if it were a continuous, uncut structure.

According to one embodiment of the present invention, the component (250) can comprises a control element that may exhibit ON-OFF and/or actively controllable capacitive or inductive characteristics. In another embodiment, the component (250) may comprise a transistor device, a FET device, a MEMs device, or other suitable control element or circuit. In one embodiment, where the component (250) exhibits OFF characteristics, it has been identified that the LC characteristics of the antenna (200) may be changed such that antenna (200) operates at a frequency 10 times higher then the frequency at which the antenna operates with a control element that exhibits ON characteristics. In one embodiment, wherein the inductance of the component (250) may be actively controlled, it has been identified that the resonant frequency of the antenna (200) may be varied quickly over a narrow bandwidth.

In one embodiment, the component (250) comprises a device that may exhibit ON-OFF and/or actively controllable capacitive or inductive characteristics, as noted above. In one embodiment, the component (250) may comprise a transistor device, an FET device, a MEMs device, or other suitable control element or circuit. In one embodiment, wherein the component (250) exhibits ON characteristics, the antenna (200) is short-circuited and no power is either radiated or received by the antenna (200). With a control element exhibiting OFF characteristics, the antenna (200) may operate normally. In one embodiment, wherein the inductance and/or capacitance of the component (250) may be controlled, it has been identified that it is possible to control the input impedance of the antenna such that the input impedance may be adjusted in order to maintain the test antenna characteristics while the antenna's environment is changing. In yet another embodiment, where the control element exhibits ON characteristics, the antenna (200) operates normally, whereas with OFF characteristics exhibited by the control element, the antenna acts as an open circuit. It is possible to control the input impedance of the antenna controlling the inductance and capacitance of the component (250). In one embodiment, the input impedance may thus be adjusted while the antenna environment is changing in order to maintain the best antenna characteristics.

In still another embodiment, the component (250) comprises a device that may exhibit ON-OFF and/or actively controllable capacitive or inductive characteristics. In one embodiment, the component (250) may comprise a transistor device, an FET device, a MEMs device, or other suitable control element or circuit. In one embodiment, with a component (250) that exhibits ON characteristics, the entire length of a stub (255) acts to influence the antenna (200) characteristics. With the component (250) exhibiting OFF characteristics, only the part of the stub (255) making electrical contact with the antenna acts to affect the LC circuit of the antenna (200). In one embodiment, it has been identified that by controlling the inductance and capacitance of the component (250) it is possible to achieve a controllable and/or continuous variation of frequency or bandwidth, or to effectuate impedance matching of the antenna (200).

If a third party, such as a rival manufacturer, were to attempt to determine the configuration and/or makeup of the antenna (200) and/or any component (250) included therein, it would be a simple matter of retrieving the antenna (200) from the mobile device (20) and analyzing the antenna (200) and the component (250). In addition, the rival manufacturer could x-ray or otherwise look into/analyze the mobile device (20), the antenna (200), and/or the component (250) embedded therein in some other invasive or non-invasive manner.

Figure 4A:
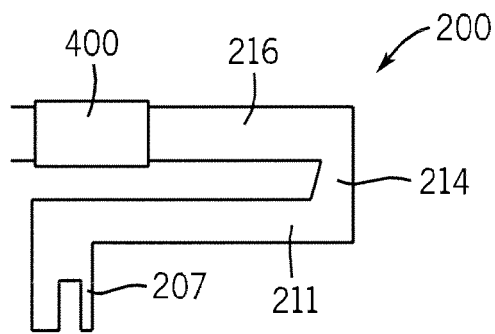
FIG. 4A illustrates a bottom view of an antenna configured according to yet another embodiment of the present invention.

To prevent the third party from determining the configuration and/or makeup of the antenna (200), a shield (400) can be configured in accordance with one embodiment of the present invention to cover and/or wrap around one or more portions of the antenna (200) and/or the component (250) as illustrated in FIG. 4A. Therefore, any attempt to x-ray or otherwise, perform non-invasive analysis without disassembling the mobile device (20) in which the antenna (200) is embedded or the antenna (200) to identify the component (250) can be thwarted. It should be noted that the shield (400) can be oriented in such a way that it "floats" around the component (250) and the first portion (216). That is, the shield (400) need not touch any operative portion of the antenna (200). In addition, the shield (400) can be configured to be as small as possible to negate or at least substantially negate any interference that the shield (400) might create in relation to the radiative properties of the antenna (200). It should be noted that the shield (400) can be constructed of, but not limited to a heavy metal, such as lead, or one or more appropriate materials which would prevent, for example, invasive and/or non-invasive analyzing methods, such as the use of x-rays.

According to another embodiment of the present invention, a material capable of being damaged when invasive analysis methods, e.g., inappropriate force or introduction of a destructive element, are encountered, can be utilized to occupy any free space between or substantially encompass the component (250) and the one or more portions (216), (211), and/or (214). Alternatively, the shield (400) itself could be comprised at least in part, of such a material. For example, a glue, high plastic component, or otherwise reactive material that can be melted and/or deformed in such a way as to render identification and/or analysis of the component (250) and/or the one or more portions (216), (211), (214) useless and ineffective can be utilized. Therefore, if the third party were to attempt to break open or break off the shield (400) to reveal, for example, the component (250) encompassed therein, the material would shatter, deform and/or react with the shield (400), also effectively damaging the component (250) beyond a point of useful recognition. In addition, the varying resonance frequency or bandwidth properties of the antenna (200) are lost. For example, the ability to effectuate changes in the operating frequency of the antenna (200), for example, to effectuate changes from a 800/1900 MHz US frequency band to a 900/1900 MHz GSM Europe and Asia frequency band would be lost. Alternatively, if a glue or other material capable of being melted were to be used, the third party attempting to melt away the shield (400) and the material underneath, would also effectively melt the component (250), again beyond a point of useful recognition. It should be noted that any appropriately, damaging material(s) besides those described above can be used in accordance with various embodiments of the invention. In addition, like the shield (400), the material can also be configured or have properties that do not substantially interfere with the radiative properties of the antenna (200).

Alternatively still, the component (250) and/or the one or more portions (216), (211), (214) could themselves comprise a shielding and/or deformable element. If an even more permanent type of protection is desired, the shield (400), the component (250), and/or the one or more portions (216), (211), (214) can be fused to one or more sides or portions of the mobile device (20) so that any attempt to disassemble the mobile device (20) would also result in deforming or otherwise breaking any of the above elements of the antenna (20). In addition, specialized tools and/or techniques can be utilized by an entity with the proper authority to disassemble or otherwise access the antenna (200), for example, for maintenance purposes, without rendering the antenna (200) inoperable.

Figure 4B:
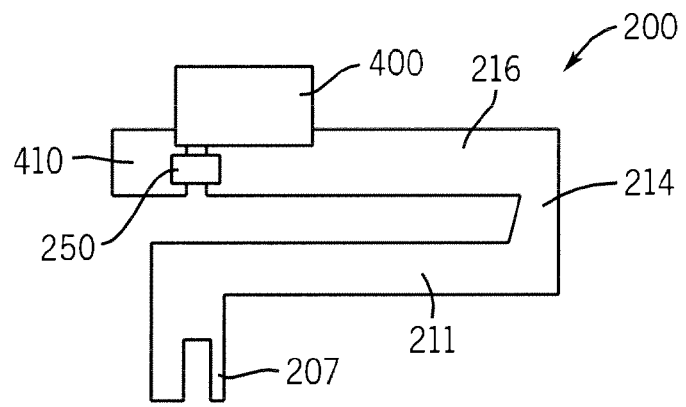
FIG. 4B illustrates a bottom view of an antenna configured according to an additional embodiment of the present invention.
Figure 4C:
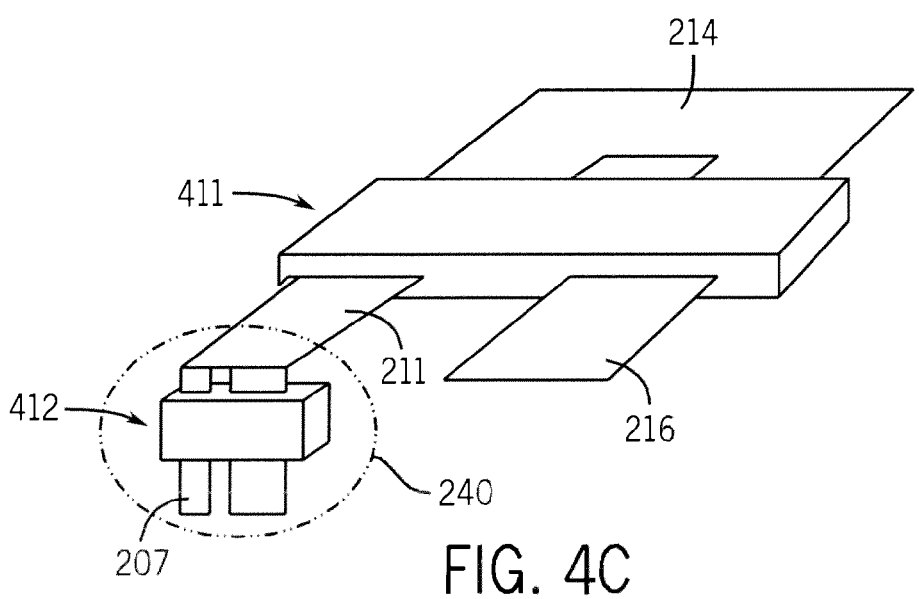
FIG. 4C illustrates a three dimensional view of an antenna configured according to still another embodiment of the present invention.

FIG. 4B illustrates another embodiment of the present invention, where an end portion (410) of the first portion (216) of the antenna (200) can comprise a material having a low melting temperature, such as a thin film material. It should be noted that one or more shields can be utilized in conjunction with the antenna (200). In addition, remaining portions of the antenna (200) can also be cut and reconstructed with one or more components (250), such as one or more portions of the matching part (230) of the antenna (200). Such an embodiment is illustrated in FIG. 4C, where a shield (411) can be utilized to shield portions of both the first portion (216) and the second portion (211) of the antenna (200), while another shield (412) can be used to shield at least the ground connection portion (207). When reconstructing one or more portions of the matching part (230) of the antenna (200), it should be noted that it may be necessary to incorporate impedance-matching. For example, in electrically small antennas, the series resonant resistance is generally too low, while the parallel resonant resistance is too high. Therefore, it may be necessary to impedance-match an antenna structure to a feed line, generally having a characteristic impedance of 50 ohms with a specified range of acceptable maximum RL.

In the embodiment illustrated in FIG. 4C, a second component/control element may be disposed in matching part (240) to effectuate changes in the resonant frequency of antenna (200) over a range of frequencies. In one embodiment, the second component/control element may be disposed between the matching part (240) and a ground point to effectuate control of the input impedance as a function of loading of the antenna (200). A control feedback signal for effectuating control may be obtained by monitoring the quality of transmissions emanating from the antenna (200). In one embodiment, a control element may be disposed in the stub to effectuate control of a second resonance corresponding to a transmitting band.

Figure 4D:
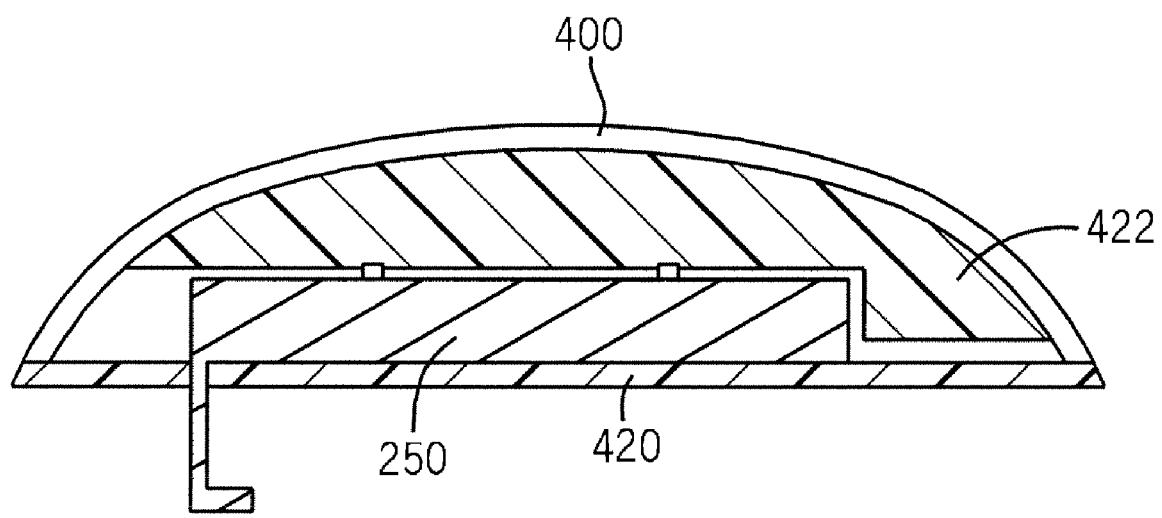
FIG. 4D illustrates a side view of an antenna configured according to yet another embodiment of the present invention.

In one embodiment illustrated in FIG. 4D, plastic injection molding can be used to create a cover for the component (250). A first plastic injection molding pass can result in a bottom plastic molded cover (420), while a second plastic injection molding pass can result in a top bottom plastic molded cover (422). Alternatively, a cover can be created with a single plastic injection molding pass. As with various embodiments described above using glue, if a third party attempts to melt or break open/apart one or both of the bottom and top plastic molded covers (420) and (422), respectively, the component (250) is damaged beyond useful/useable recognition. In addition, the component (250) can comprise a sputtered/sputtered metal material.

It should be understood that one or more antenna structures, such as the antenna (200) can be utilized in conjunction with each other to effectuate various configurations resulting in various radiative properties of the one or more antenna structures. When two or more antenna structures are utilized, the antenna structures can be operatively connected using one or more components (250). For example, utilizing one or more components (250), one or more of the two or more antenna structures can be turned ON or OFF, offering wider antenna coverage and bandwidth. Thus, it is understood that antenna (200), as well as other antennas/antenna structures described herein, may vary in design and yet remain within the scope of the claimed invention.

Figure 5A:
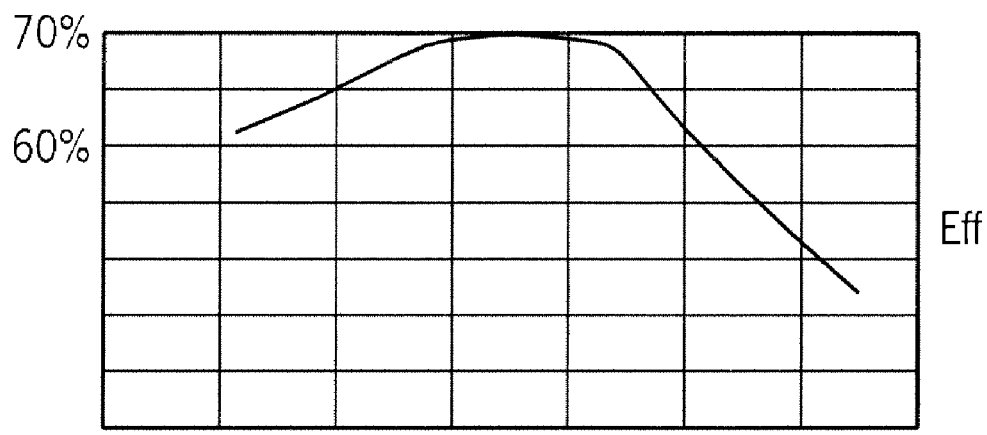
FIGS. 5A and 5B illustrate achieved return loss and efficiency of an antenna configured according to one embodiment of the present invention.
Figure 5B:
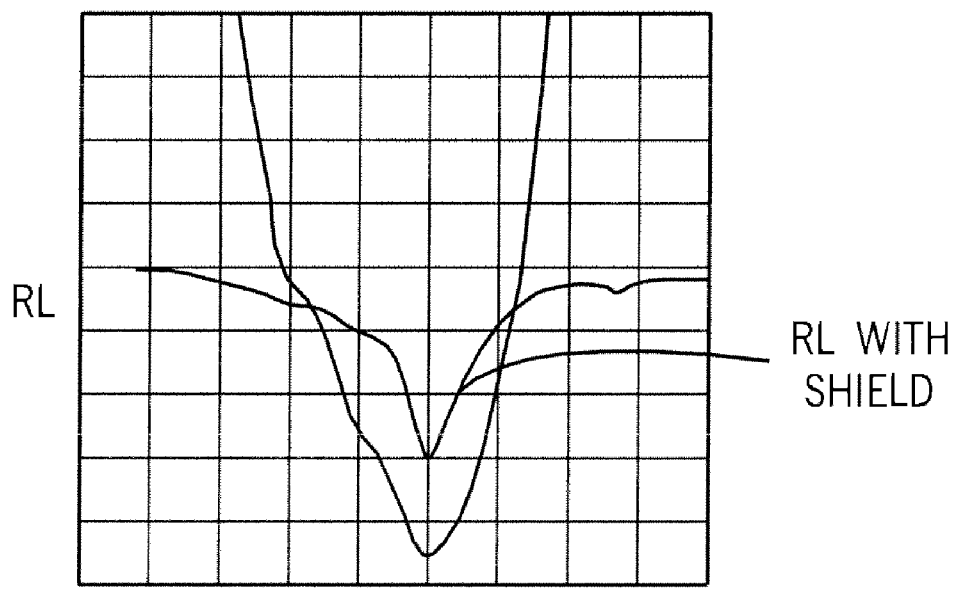

FIGS. 5A and 5B graphically illustrate the observed RL and efficiency for an antenna (200) utilizing at least one shield (400) to protect one or more components (250) and/or one or more portions (207), (211), (214), and (216). It can be seen that the maximum RL and achieved efficiency is for practical intents and purposes, on par with an antenna (200) having no shield (400) element included therein. Therefore, depending on the material(s) utilized for one or more shields (400), one or more components (250), and/or one or more portions (207), (211), (214), and (216), the radiative properties of the antenna (200) can be sufficiently reproduced while being substantially protected from third party analysis.

It should be noted that although the following description is directed generally to antennas, any electronic component design or element for which protection from analysis and copying is desired can be designed and/or constructed in accordance with various embodiments of the present invention. For example, an electronic device can be comprised of a first operative portion and a second operative portion, where the first and second operative portions are connected by a component. As with the antenna (200), effective operation of the electronic device is prevented when the component is not connecting the first and second operative portions. A shield structure can also be coupled to the component and/or the electronic device to prevent any attempts to invasively and/or non-invasively analyze the electronic device and/or the component.

FIGS. 8A-13B illustrate various other embodiments of the present invention in which an active device can be utilized to effectively boost efficiency of an existing antenna, such as those described above. The active device can be implemented as one or more antenna coils which can be integrated with the existing antenna of a mobile device, for example, when it is inconvenient or not possible to utilize a user's body to act as an extension of the existing antenna, and/or for example, when low frequency excitation is required.

Figure 8A:
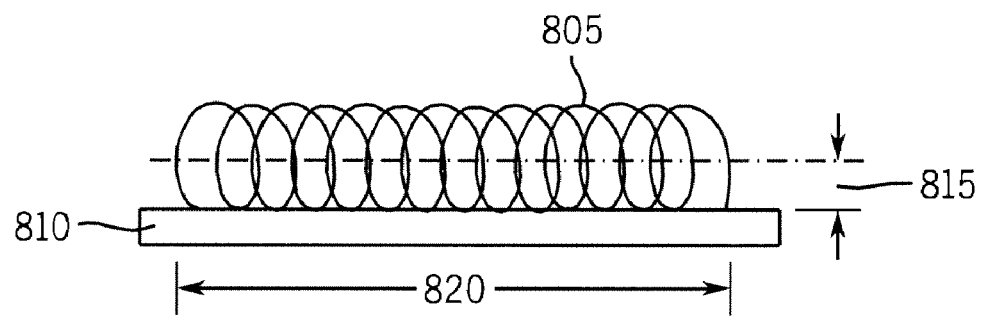
FIGS. 8A and 8B illustrate another embodiment of the invention incorporating an antenna coil applicable to low frequency applications.
Figure 8B:
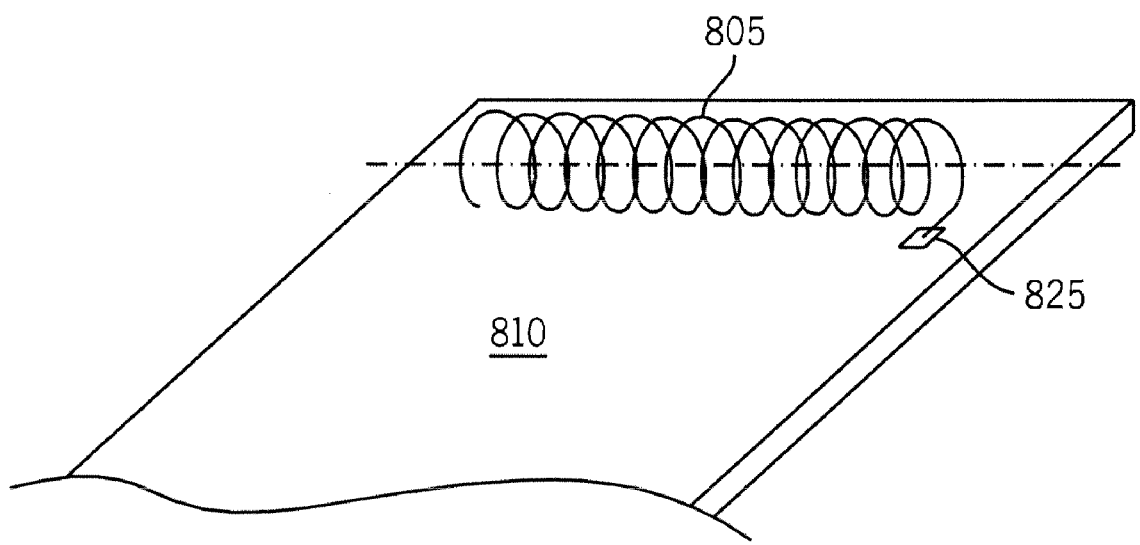

FIGS. 8A and 8B show a side view and a perspective view, respectively, of an antenna coil (805), which can be made of a variety of conducting materials, such as but not limited to, copper. The antenna coil (805) can be configured to have some predetermined length $l_1$ indicated by arrow (815) and a pitch $l_2$ indicated by arrow (820). In addition, the antenna coil (805) is connected to a printed circuit board (PCB) (810), where the PCB (810) can also have integrated thereon, one or more operative or non-operative elements of a device, such as the mobile device (20) described above. Alternatively, the PCB (810) can be utilized solely for integrating the antenna coil (805) with the mobile device (20). It should be noted that the length $l_1$ and the pitch $l_2$ can determine an adjustment frequency. In addition, length $l_1$ and the pitch $l_2$ can provide a mechanism to develop a desired efficiency of the antenna coil (805). Furthermore the antenna coil (805) can be configured in other shapes, not limited to coils, resulting in a meandering line antenna.

Figure 9A:
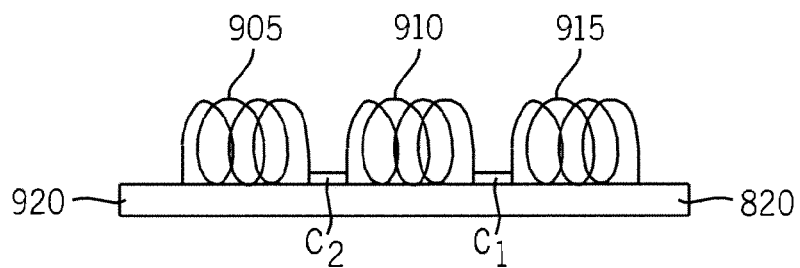
FIGS. 9A and 9B illustrate yet another embodiment of the invention incorporating multiple antenna coils utilized in conjunction with multiple filter components applicable to low frequency applications.
Figure 9B:
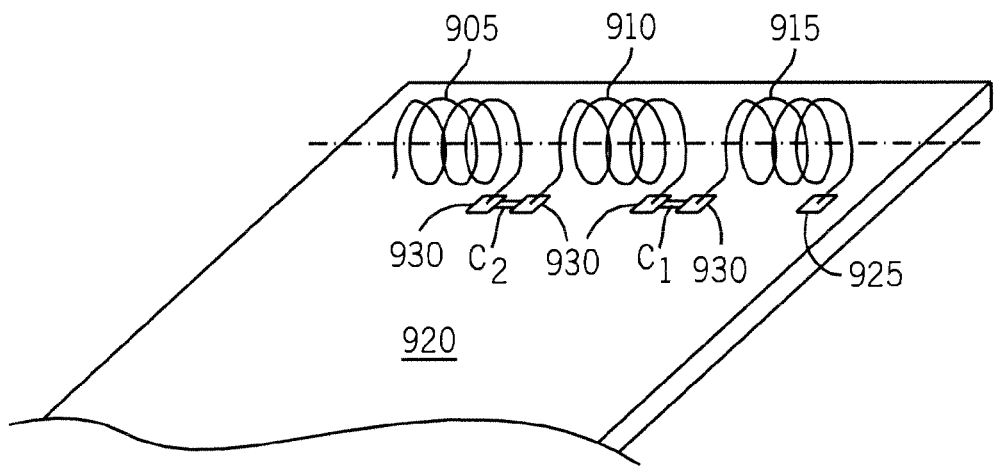

FIGS. 9A and 9B show a side view and a perspective view, respectively, of a plurality of antenna coils (905), (910), (915) integrated unto a PCB (920) via a feed (925). The plurality of antenna coils (905), (910), (915) are utilized to reduce actual coil length, such as the antenna coil (805) described above. Connecting antenna coil (905) to antenna coil (910) and connecting antenna coil (910) to antenna coil (915) are components $C_2$, and $C_1$, respectively, via pads (930). The components C1 and C2 can be inductors or other elements, as described above, which can add inductive and/or electrical length to the antenna coils (905), (910), (915). Therefore, the main radiative part of this antenna configuration can be considered to be the number of coils put in series with each other.

Figure 9C:
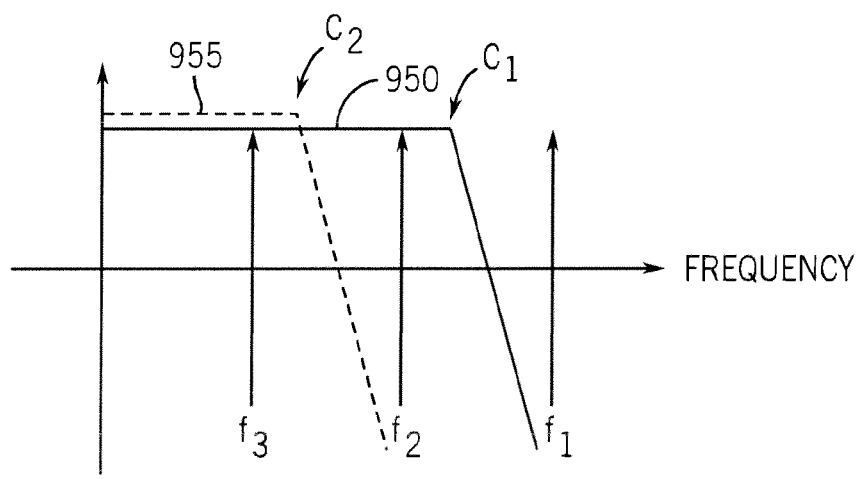
FIG. 9C shows a graphical representation of multiple frequency environments wherein the multiple antenna coils of FIGS. 33A and 33B can be utilized.

In the antenna configuration described with regard to FIGS. 9A and 9B, components C1 and C2 can each act as a filter. Therefore, depending on the action(s) of the components C1 and C2, this antenna configuration can be utilized in a multiple frequency environment, similar to that described above for a magnetic dipole antenna. In particular, the antenna coil (915) can be tuned for a first frequency $f_1$, for example, a high frequency, the antenna coil (910) can be tuned with the antenna coil (915) to read a second frequency $f_2$, and the antenna coil (905) can be tuned with both the antenna coils (910), (915) to reach a third frequency $f_3$. FIG. 9C illustrates a graphical representation of such an operation, where the component $C_1$ can act as a low pass filter tuned to cut off below the frequency $f_1$ indicated by the solid line (950). The component $C_2$ can also act as a filter, which can be tuned to cut off below the frequency $f_2$ indicated by the dotted line (955).

Figure 10A:
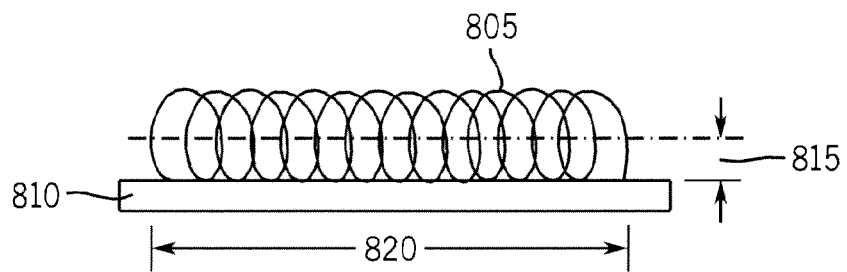
FIGS. 10A-10C illustrate a further embodiment of the invention incorporating a trace element for operating in conjunction with the antenna coil of FIGS. 32A and 32B.
Figure 10B:
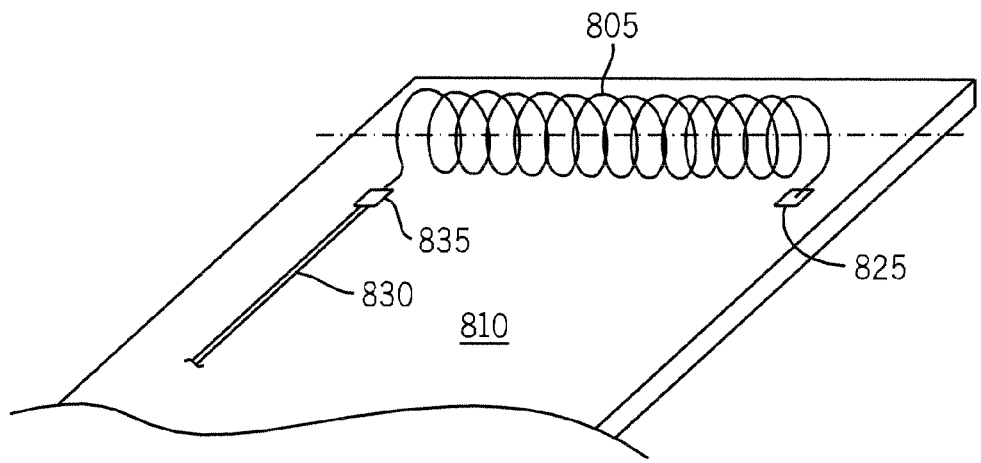
Figure 10C:
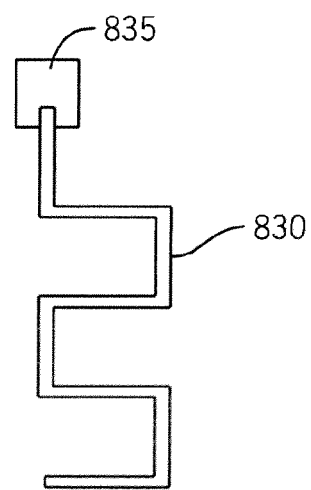

FIGS. 10A and 10B show yet another embodiment of the present invention, where the antenna coil (805) is connected to a trace element (830). The trace element (830) can be connected to the antenna coil (805) and to the PCB (810) by a pad (835). Addition of the trace element (830) to the antenna coil (805) increases the effective electrical length of the antenna coil (805). It should be noted that the trace element (830) can be configured in various shapes, such as that shown in FIG. 10C. It should also be noted that inductive-type components, such as the components $C_1$ and $C_2$ can be integrated therewith.

Figure 11A:
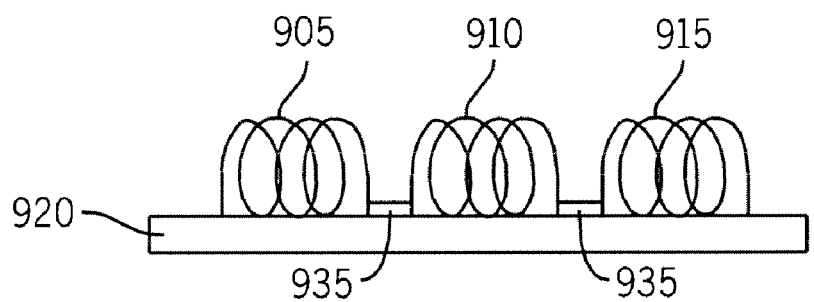
FIGS. 11A and 11B illustrate an embodiment of the invention incorporating the multiple antenna coils of FIGS. 33A and 33B, the trace element of FIGS. 34A and 34B and active elements.
Figure 11B:
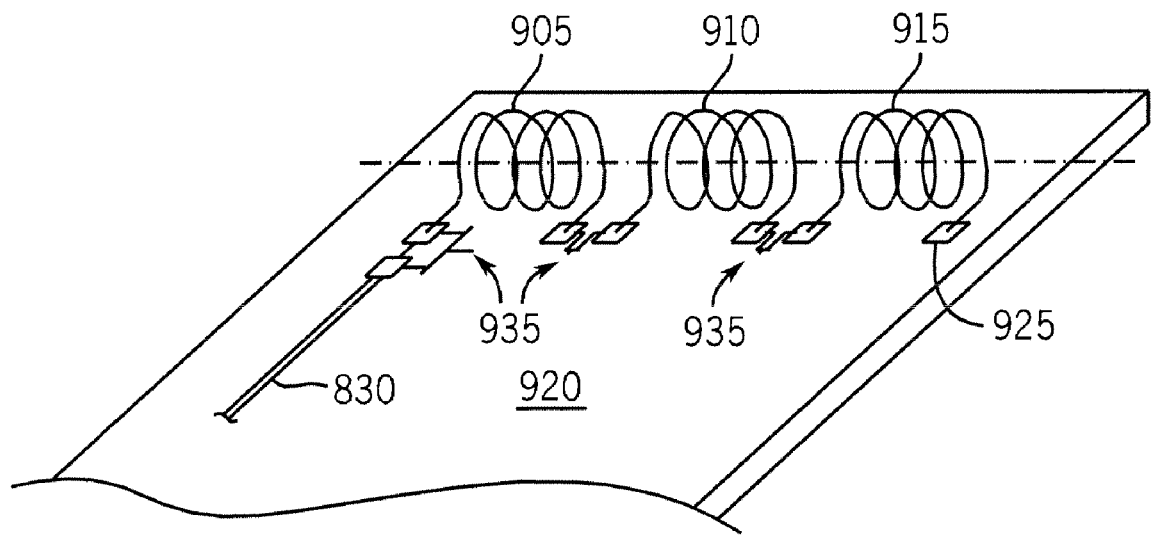

In accordance with another embodiment of the present invention, FIGS. 11A and 11B illustrate the multiple antenna coils (905), (910), (915) being connected via a plurality of active/switching elements (935). In addition, one of the plurality of active/switching elements (935) can be utilized to connect the trace element (830) the antenna coil (905). Each of the plurality of active/switching elements (935) can comprise a device that may exhibit ON-OFF and/or actively controllable capacitive/inductive characteristics. It should be noted that each of the active/switching elements (935) may comprise transistor devices, FED devices, MEMs devices, or other suitable control element or circuits capable of exhibiting ON-OFF and/or actively controllable capacitive inductive characteristics. In this particular embodiment, each of the plurality of active/switching elements (935) can be a field effect transistor (FET) acting as a switch. By switching a FET ON or OFF, the antenna coils (905), (910), (915) can be tuned to any desired frequency In addition more or less antenna coils can be utilized in series, and by utilizing multiple FETs, targeting frequencies ranging among other several hundreds of MHZ can be achieved, for example, 200 MHz, 400 MHz, 700 MHz, 800 MHz, 900 MHz, 1800 MHz, 1900 MHz, etc.

Figure 12A:
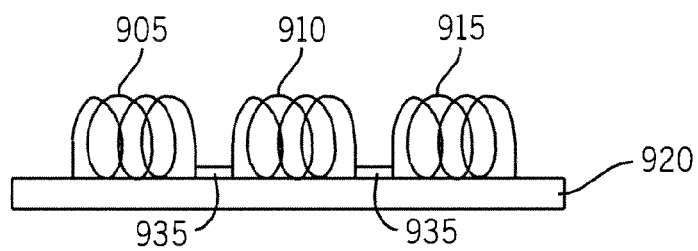
FIGS. 12A-12C illustrate an embodiment of the invention utilizing orthogonal orientation of multiple antenna coils.
Figure 12B:
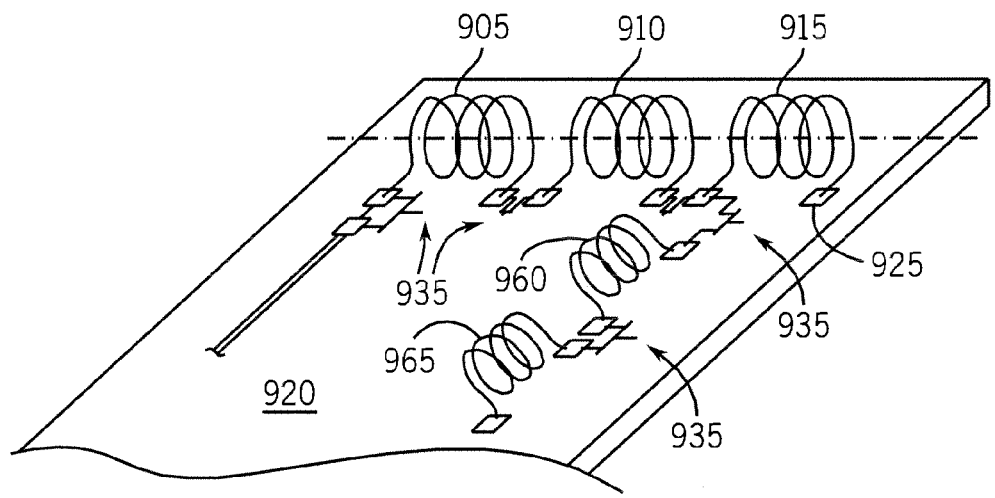
Figure 12C:
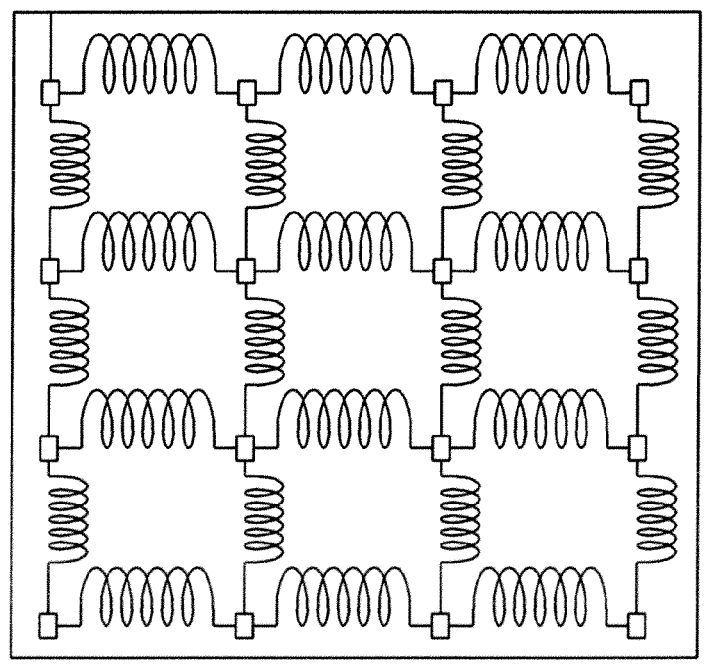

FIGS. 12A-12C show a side view, a perspective view, and a top view, respectively, of an embodiment of the present invention, where multiple antenna coils (905), (910), (915), (960), (965) can be oriented in an orthogonal manner. It should be noted that any number of antenna coils can be utilized. Orthogonal configurations can be suitable for polarization diversity. In addition, orthogonal configurations can provide a desirable level of control with regard to frequency bands. FIG. 12C, in particular illustrates an active control switching a current path.

Figure 13A:
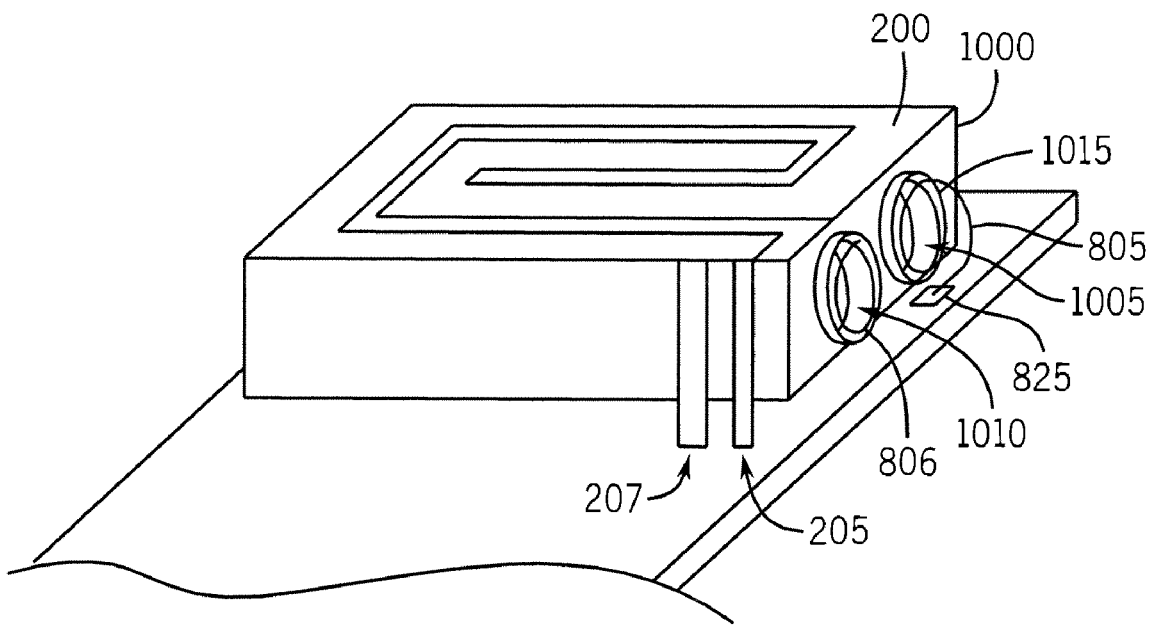
FIGS. 13A and 13B illustrate another embodiment of the invention integrating multiple antenna coils of FIGS. 8A and 8B with an existing antenna element.
Figure 13B:
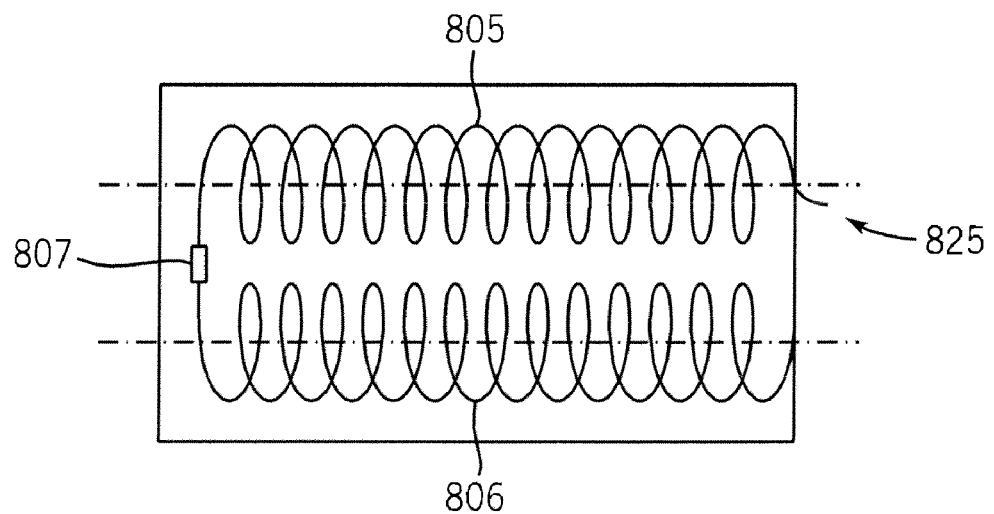

FIGS. 13A and 13B show a perspective view and a cutout top view, respectively, of an embodiment of the present invention, where double antenna coils (805), (806) are embedded in a support (1000) upon which an existing antenna (200) is already supported. The existing antenna (200) can be a magnetic dipole antenna, such as that described above, where a ground leg (207) and a feed leg (205) connect to the PCB (810). The support (1000) can be configured with two elongated cavities (1005), (1010) for supporting one of each of the double antenna coils (805), (806). The support (1000) can also be configured to be opened at section (1015) to allow introduction of the antenna coils (805), (806) into the support (1000). A first one of the double antenna coils (805) is connected to the PCB (810) via a feed (825). Furthermore, the first one of the double antenna coils (805) can be connected to a second one of the double antenna coils (806) via a contact (807). It should be noted that the contact (807) can be a continuation of either of the first or second ones of the double antenna coils (805), (806). Alternatively, the contact (807) can a spring contact, a contact plate, or any other appropriate type of connector. It should be noted that the existing antenna (200) can also be connected directly to one or more of the first or second ones of the double antenna coils (805), (806) via a spring contact, a heatstake, or soldering (not shown).

Figure 14:
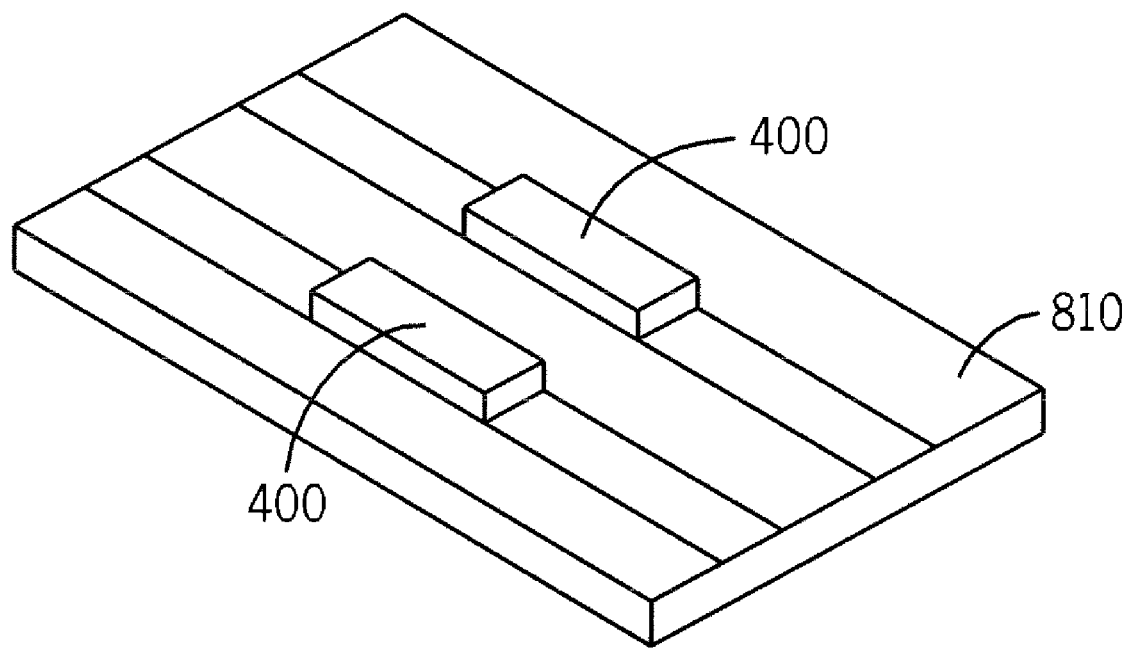
FIG. 14 illustrates shields configured in accordance with various embodiments of the present invention to protect the one or more antenna coils of FIGS. 13A and 13B from x-rays.

FIG. 14 illustrates two sets of double antenna coils, such as those described with respect to FIGS. 13A and 13B, with protective shields (400) encompassing each of two supports (1000) on a PCB (810). Therefore, the first and/or second ones of the double antenna coils (805), (806) can also be protected from x-rays and the like, as described above.

Thus, it will be recognized that the preceding description embodies one or more invention that may be practiced in other specific forms without departing from the spirit and essential characteristics of the disclosure and that the invention is not to be limited by the foregoing illustrative details, but rather is to be defined by the appended claims.

What is claimed is:

1. An antenna for application on a mobile device, comprising:
   an antenna element having a component electrically coupled thereto to reconstruct a radiative property of the antenna element; and
   a shield structure non-electrically coupled to at least one of the antenna element and the component, wherein the shield structure is positioned such that an attempt to at least one of invasively and non-invasively analyze at least one of the mobile device, the antenna element, and the component is prevented.

2. The antenna of claim 1, wherein the antenna element is configured to be in a detuned state to substantially negate the radiative property of the antenna element when the component is not electrically coupled thereto.

3. The antenna of claim 2, wherein the antenna element is configured to be in a detuned state by cutting at least a first portion of the antenna element from a remaining portion of the antenna element.

4. The antenna of claim 3, wherein the component comprises at least one of an inductive element and an element having electrical properties capable of reconstructing the radiative property of the antenna element when electrically coupled to the at least first portion and the remaining portion of the antenna element.

5. The antenna of claim 3, wherein the at least a first portion of the antenna element comprises a thin-film material having a substantially low melting temperature.

6. The antenna of claim 1, wherein the shield structure comprises a metallic material incapable of being x-rayed.

7. The antenna of claim 1, further comprising a damageable element configured to bind the shield structure to at least one of the antenna element and the component, wherein upon an attempt to invasively analyze at least one of the antenna element and the component, the at least one of the antenna element and the component is also damaged beyond useful recognition.

8. The antenna of claim 7, wherein the damageable element comprises at least one of a glue-based material and a high plastic-content material having a low melting temperature.

9. The antenna of claim 7, wherein the damageable element is configured to not substantially interfere with the radiative property of the antenna element.

10. The antenna of claim 7, wherein the damageable element comprises at least one plastic injection molded cover.

11. The antenna of claim 1, wherein the shield structure is configured to not substantially interfere with the radiative property of the antenna element.

12. The antenna of claim 1, wherein the antenna element comprises a capacitively loaded dipole antenna element.

13. The antenna of claim 1, wherein the antenna element comprises a first antenna coil electrically coupled to a printed circuit board of the mobile device, the first antenna coil being at least one of frequency and efficiency adjustable via at least one of a length of the antenna coil and a pitch of the first antenna coil.

14. The antenna of claim 13, wherein the antenna element further comprises a second antenna coil electrically coupled to the first antenna coil via the component, the second antenna coil being at least one of frequency and efficiency adjustable via at least one of a length of the antenna coil and a pitch of the second antenna coil, and the component having the ability to be configured for actively reconfiguring the radiative property of the antenna element to form a multiple band antenna.

15. The antenna of claim 1, further comprising:
   a first antenna coil electrically coupled to a printed circuit board of the mobile device, the first antenna coil being at least one of frequency and efficiency adjustable via at least one of a length of the antenna coil and a pitch of the first antenna coil;
   a second antenna coil electrically coupled to the first antenna coil via a connecting portion, the second antenna coil being at least one of frequency and efficiency adjustable via at least one of a length of the antenna coil and a pitch of the second antenna coil; and
   a supporting structure configured for embedding the first and second antenna coils therein and for supporting the antenna element thereon, wherein at least one of a ground leg and a feed leg is electrically coupled to the printed circuit board.

16. The antenna of claim 1, wherein the component comprises a control element being configured for actively reconfiguring a resonant frequency of the antenna to from a multiple band antenna.

17. The antenna of claim 1, further comprising at least one additional component, a combination of the component and the at least one additional component being configured for actively reconfiguring a resonant frequency of the antenna to form a multiple band antenna.

18. The antenna of claim 1, wherein the component comprises a sputtered/spultered metal material.

19. A capacitively loaded dipole antenna for use in a mobile device, comprising:
   a conductive top portion including a first portion coupled to a second portion by a connection portion;
   a ground plane portion disposed opposite to the conductive top portion;
   a component for enabling at least one of reconstructing a radiative property of the antenna element and active reconfiguration of the antenna, wherein the component is connected to at least two of the first portion, the second portion, the connection portion, the conductive top portion, and the ground plane portion; and
   a shield structure non-electrically coupled to at least one of the antenna element and the component, wherein the shield structure is positioned such that an attempt to at least one of invasively and non-invasively analyze at least one of the mobile device, the antenna element, and the component is prevented.

20. The antenna of claim 19, wherein the antenna element is detuned to substantially negate the radiative property of the antenna element when the component is not electrically coupled thereto.

21. The antenna of claim 19, wherein the component comprises at least one of an inductive element and an element having electrical properties capable of reconstructing the radiative property of the antenna element.

22. The antenna of claim 19, wherein activation or deactivation of the component effectuates a change in surface geometry of the conductive top portion causing the antenna to be actively reconfigured in accordance with multiple frequencies.

23. The antenna of claim 19, wherein the shield structure comprises a metallic material incapable of being x-rayed.

24. The antenna of claim 23, wherein the damageable element comprises at least one plastic injection molded cover.

25. The antenna of claim 19, further comprising a damageable element configured to bind the shield structure to at least one of the antenna element and the component, wherein upon an attempt to invasively analyze at least one of the antenna element and the component, the at least one of the antenna element and the component is also damaged beyond useful recognition.

26. The antenna of claim 25, wherein the damageable element comprises at least one of a glue-based material and a high plastic-content material having a low melting temperature.

27. An electronic device, comprising:
a first portion;
a second portion coupled to the first portion by a component, wherein effective operation of the electronic device is prevented when the component is absent from the electronic device; and
a shield structure coupled to the component, wherein the shield structure is positioned such that an attempt to at least one of invasively and non-invasively analyze at least one of the electronic device and the component is prevented.

28. The device of claim 27, wherein the shield structure comprises a metallic material incapable of being x-rayed.

29. The device of claim 27, further comprising a damageable element configured to bind the shield structure to at least one of the electronic device and the component, wherein upon an attempt to invasively analyze at least one of the electronic device and the component, the at least one of the electronic device and the component is also damaged beyond useful recognition.

30. The device of claim 29, wherein the damageable element comprises at least one of a glue-based material and a high plastic-content material having a low melting temperature.

31. The device of claim 29, wherein the damageable element comprises at least one plastic injection molded cover.

32. The device of claim 27, wherein the first portion and the second portion respectively comprise a first and a second conductive portion of an antenna element.

* * * * *